(12) United States Patent
Nagahama et al.

(10) Patent No.: US 9,698,321 B2
(45) Date of Patent: Jul. 4, 2017

(54) LIGHT-EMITTING APPARATUS, ILLUMINATION APPARATUS, AND METHOD OF MANUFACTURING LIGHT-EMITTING APPARATUS

(71) Applicant: Panasonic Intellectual Property Management Co., Ltd., Osaka-shi, Osaka (JP)

(72) Inventors: Katsuyuki Nagahama, Hyogo (JP); Atsuyoshi Ishimori, Osaka (JP); Toshifumi Ogata, Osaka (JP); Keiji Kiba, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/240,638

(22) Filed: Aug. 18, 2016

(65) Prior Publication Data

US 2017/0062673 A1 Mar. 2, 2017

(30) Foreign Application Priority Data

Aug. 31, 2015 (JP) ................. 2015-171575

(51) Int. Cl.
*H01L 33/56* (2010.01)
*H01L 33/50* (2010.01)
*H01L 33/60* (2010.01)

(52) U.S. Cl.
CPC ............ *H01L 33/56* (2013.01); *H01L 33/507* (2013.01); *H01L 33/60* (2013.01); *H01L 2933/005* (2013.01)

(58) Field of Classification Search
CPC .......... H01L 2924/00; H01L 2924/181; H01L 2924/00012; H01L 33/56; H01L 33/60
See application file for complete search history.

(56) References Cited

U.S. PATENT DOCUMENTS

| 8,049,237 | B2 | 11/2011 | Yamada et al. |
| 8,564,000 | B2* | 10/2013 | Hussell ............... H01L 25/0753 257/100 |
| 8,624,271 | B2 | 1/2014 | Reiherzer et al. |
| 9,153,561 | B2* | 10/2015 | Sasano ................ H01L 25/0753 |

(Continued)

FOREIGN PATENT DOCUMENTS

| JP | 2009-164157 A | 7/2009 |
| JP | 2009-182307 A | 8/2009 |

(Continued)

*Primary Examiner* — Jaehwan Oh
(74) *Attorney, Agent, or Firm* — McDermott Will & Emery LLP

(57) ABSTRACT

A light-emitting apparatus includes: a ceramic substrate; a light-emitting element mounted on the ceramic substrate; a sealing member sealing the light-emitting element; a buffer layer formed on the ceramic substrate and surrounding the light-emitting element; and a dam member, at least a portion of which is on a top surface of the buffer layer and which is for blocking the sealing member. The dam member is formed in such a way that one end of the dam member which faces the sealing member and is closer to the light-emitting element than the opposite end of the dam member is in contact with the ceramic substrate while the opposite end is out of contact with the ceramic substrate.

10 Claims, 7 Drawing Sheets

(56) References Cited

U.S. PATENT DOCUMENTS

| | | | |
|---|---|---|---|
| 9,243,791 B2* | 1/2016 | Agatani | H01L 25/0753 |
| D770,987 S * | 11/2016 | Ishimori | D13/180 |
| 2007/0170454 A1* | 7/2007 | Andrews | H01L 33/52 |
| | | | 257/100 |
| 2009/0166657 A1 | 7/2009 | Yamada et al. | |
| 2011/0089441 A1* | 4/2011 | Wu | H01L 25/0753 |
| | | | 257/91 |
| 2011/0199021 A1 | 8/2011 | Oyaizu et al. | |
| 2011/0254022 A1 | 10/2011 | Sasano | |
| 2011/0317416 A1 | 12/2011 | Oyaizu et al. | |
| 2012/0007112 A1 | 1/2012 | Yamada et al. | |
| 2015/0117020 A1* | 4/2015 | Hata | H01L 25/0753 |
| | | | 362/294 |
| 2015/0179891 A1 | 6/2015 | Yamada et al. | |
| 2015/0311414 A1* | 10/2015 | Lin | H01L 33/005 |
| | | | 257/88 |
| 2016/0079492 A1* | 3/2016 | Ishimori | H01L 33/54 |
| | | | 257/98 |
| 2016/0111402 A1 | 4/2016 | Sasano | |
| 2017/0038051 A1* | 2/2017 | Fukasawa | F21V 29/503 |

FOREIGN PATENT DOCUMENTS

| | | |
|---|---|---|
| JP | 2011-060961 A | 3/2011 |
| JP | 2011-238902 A | 11/2011 |
| JP | 2012-009781 A | 1/2012 |
| JP | 5119917 B2 | 1/2013 |
| JP | 5169263 B2 | 3/2013 |

* cited by examiner

LIGHT-EMITTING APPARATUS, ILLUMINATION APPARATUS, AND METHOD OF MANUFACTURING LIGHT-EMITTING APPARATUS

CROSS REFERENCE TO RELATED APPLICATION

This application claims the benefit of priority of Japanese Patent Application Number 2015-171575 filed on Aug. 31, 2015, the entire content of which is hereby incorporated by reference.

BACKGROUND

1. Technical Field

The present disclosure relates to a light-emitting apparatus in which a light-emitting element is mounted on a substrate, an illumination apparatus including the light-emitting apparatus, and a method of manufacturing the light-emitting apparatus.

2. Description of the Related Art

In a known illumination apparatus, a light-emitting apparatus (a light-emitting module) that uses a semiconductor light-emitting element, such as an LED (light-emitting diode), as a light source is mounted. Specifically, a light-emitting apparatus in which a plurality of LEDs mounted on a substrate are surrounded by a light-reflecting resin (hereinafter referred to also as a dam member) is known (for example, see Japanese Unexamined Patent Application Publication No. 2009-182307). A sealing member that seals the LEDs is provided in a region surrounded by the dam member, and is blocked by the dam member.

SUMMARY

Although it is conceivable to use a ceramic substrate as the substrate, there are cases where the sealing member or a component of a resin material constituting the dam member may seep into an external region on the ceramic substrate which is located, outside of the dam member. There is the risk that this seeping may cause a contact failure of electrodes in the external region or result in degraded appearance, for example.

Thus, an object of the present disclosure is to provide a light-emitting apparatus and an illumination apparatus that are capable of reducing the occurrence of the sealing member or a component of the resin material constituting the dam member seeping into the external region so as to reduce the occurrence of electrode contact failure, appearance degradation, or the like.

A light-emitting apparatus according to an aspect of the present disclosure includes: a ceramic substrate; a light-emitting element mounted on the ceramic substrate; a sealing member sealing the light-emitting element; a buffer layer formed on the ceramic substrate and surrounding the light-emitting element; and a dam member, at least a portion of which is provided on a top surface of the buffer layer and which is for blocking the sealing member, wherein the dam member has one end in contact with the ceramic substrate and an opposite end out of contact with the ceramic substrate, the one end facing the sealing member and being closer to the light-emitting element than the opposite end.

An illumination apparatus according to another aspect of the present disclosure includes the above-described light-emitting apparatus.

A method of manufacturing a light-emitting apparatus according to another aspect of the present disclosure is a method of manufacturing a light-emitting apparatus including: a ceramic substrate; a light-emitting element mounted on the ceramic substrate; a sealing member sealing the light-emitting element; a buffer layer formed on the ceramic substrate and surrounding the light-emitting element; and a dam member which blocks the sealing member from flowing outside the dam member, at least a portion of the dam member being provided on a top surface of the buffer layer, and the method includes forming the dam member with one end in contact with the ceramic substrate and an opposite end out of contact with the ceramic substrate, the one end facing the sealing member and being closer to the light-emitting element than the opposite end.

According to the present disclosure, it is possible to reduce the occurrence of electrode contact failure, appearance degradation, or the like by reducing the occurrence of the sealing member or a component of the resin material constituting the dam member seeping into the external region.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, a light-emitting apparatus, etc., according to embodiments are described with reference to the Drawings.

Note that each of the embodiments described below shows a general or specific example. The numerical values, shapes, materials, structural elements, the arrangement and connection of the structural elements, steps, the processing order of the steps, etc., shown in the following embodiments are mere examples, and therefore do not limit the present disclosure. As such, among the structural elements in the following embodiments, those not recited in any one of the independent claims which indicate the broadest inventive concepts are described as arbitrary structural elements.

Furthermore, the respective figures are schematic illustrations and are not necessarily precise illustrations. Additionally, in the figures, substantially identical elements are assigned the same reference signs, and there are cases where overlapping descriptions are omitted or simplified.

Embodiment 1

Configuration of Light-Emitting Apparatus

Figure 1:
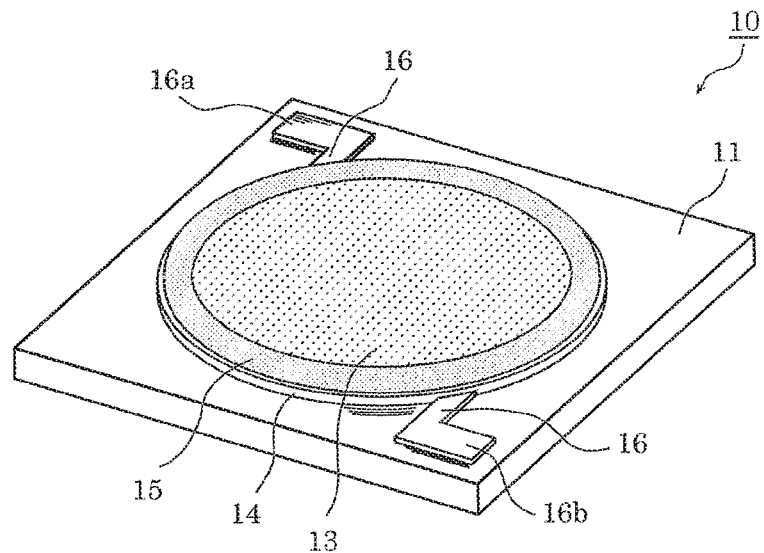
FIG. 1 is perspective view of an external appearance of a light-emitting apparatus according to Embodiment 1.
Figure 2:
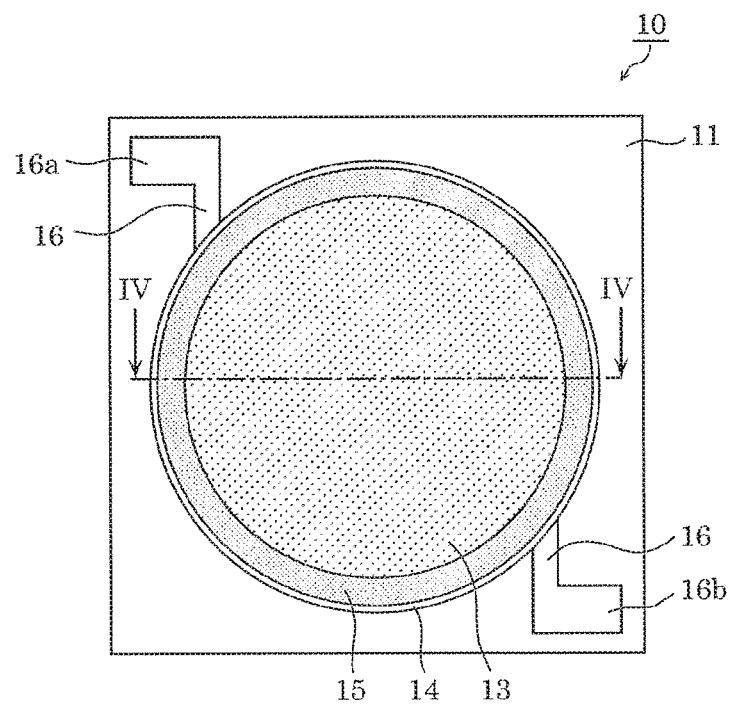
FIG. 2 is a plan view of a light-emitting apparatus according to Embodiment 1.
Figure 3:
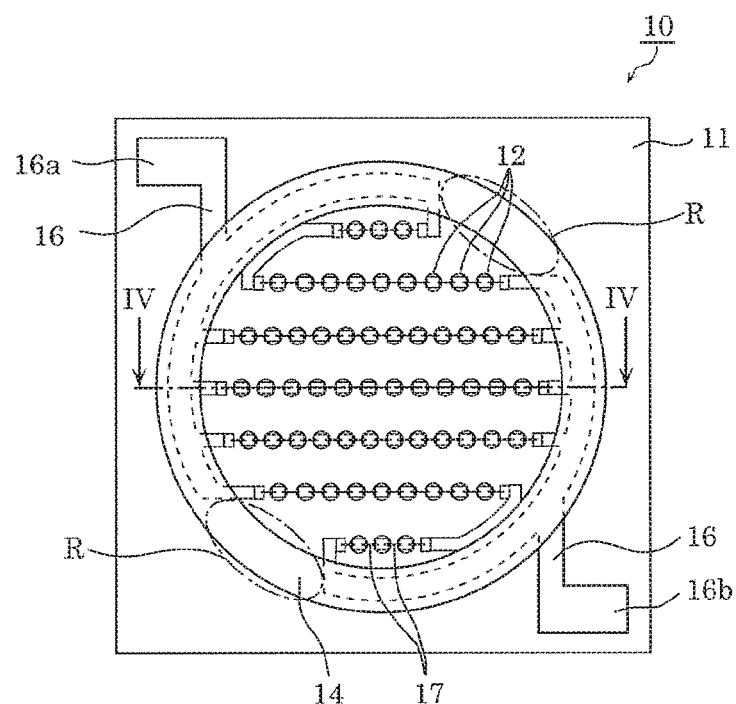
FIG. 3 is a plan view illustrating the internal structure of a light-emitting apparatus according to Embodiment 1.
Figure 4:
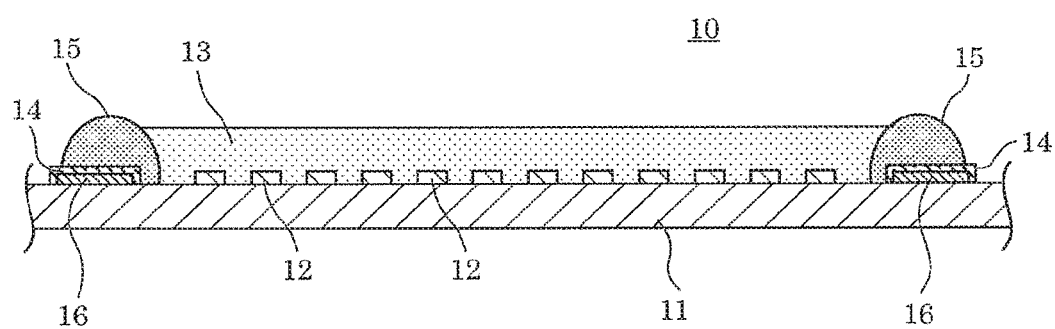
FIG. 4 is a cross-sectional view of a light-emitting apparatus, taken along line INT-IV in FIG. 2.

First, the configuration of a light-emitting apparatus according to Embodiment 1 will be described with reference to the Drawings. FIG. 1 is a perspective view of an external appearance of a light-emitting apparatus according to Embodiment 1. FIG. 2 is a plan view of a light-emitting apparatus according to Embodiment 1. FIG. 3 is a plan view illustrating the internal structure of a light-emitting apparatus according to Embodiment 1. FIG. 4 is a cross-sectional view of a light-emitting apparatus, taken along line IV-IV in FIG. 2. Note that FIG. 3 is a plan view of the light-emitting apparatus which corresponds to that illustrated in FIG. 2 and illustrates the internal structure thereof including the arrangement of LED chips 12 and a wiring pattern with sealing member 13 and dam member 15 removed.

Light-emitting apparatus 10 according to Embodiment 1 includes substrate 11, two or more LED chips 12, sealing member 13, buffer layer 14, and dam member (side sealing member) 15 as illustrated in FIG. 1 to FIG. 4.

Light-emitting apparatus 10 is what is called a COB (chip-on-board) LED module in which LED chips 12 are directly mounted on substrate 11.

Substrate 11 has a wiring region in which wiring 16 is provided. Note that wiring 16 (as well as electrode 16a and electrode 16b) is metal wiring for supplying electric power to LED chips 12. Substrate 11 is formed of a porous substrate, such as a ceramic substrate, for example.

The porous substrate may be a substrate that is porous per se, such as a ceramic substrate, or may be a substrate formed by coating a surface of an originally non-porous substrate with a porous material. Furthermore, examples of the porous substrate may include a substrate formed by sintering fine particles.

An alumina substrate made of aluminum oxide (alumina), an aluminum nitride substrate made of aluminum nitride, or the like is used as the ceramic substrate.

Note that a substrate having a high optical reflectivity (for example, an optical reflectivity of 90% or higher), for example, may be used as substrate n Using a substrate having a high optical reflectivity as substrate 11 allows light emitted by LED chips 12 to be reflected off the surface of substrate 11. This results in an increase in the light extraction rate of light-emitting apparatus 10. Examples of the substrate include a white ceramic substrate that uses alumina as a base material.

Alternatively, a light-transmissive substrate having high light transmittance may be used as substrate 11. Examples of the substrate include a light-transmissive ceramic substrate made of polycrystalline alumina or aluminum nitride.

Note that substrate 11 has a rectangular shape in Embodiment 1, but may have a circular shape or another shape.

LED chip 12 is one example of the light-emitting element and is a blue LED chip which emits blue light. For example, a gallium nitride LED chip formed using an InGaN-based material and having a central wavelength (a peak wavelength of the light emission spectrum) in the range from 430 nm to 480 nm is used as LED chip 12.

A plurality of light-emitting element lines including two or inure LED chips 12 are provided on substrate 11. From the structural perspective, seven light-emitting element lines are provided on substrate 11 in such a way as to be fit within the shape of a circle as illustrated in FIG. 3.

From the electrical perspective, five light-emitting element lines each including 12 LED chips 12 connected in series are provided on substrate 11. These five light-emitting element lines are connected in parallel and emit light with electric power supplied between electrode 16a and electrode 16b.

Although details are not illustrated in the Drawings, LED chips 12 are connected in series in a chip-to-chip configuration mainly by bonding wire 17 (some of LED chips 12 are connected by wiring 16). For example, gold (Au), silver (Ag), copper (Cu), or the like is used as a metal material of bonding wire 17 as well as a metal material of wiring 16, electrode 16a, and electrode 16b mentioned above.

Sealing member 13 seals two or more LED chips 12, bonding wire 17, and wiring 16. Specifically, sealing member 13 is formed of a light-transmissive resin material containing yellow phosphor particles as a wavelength converting element. As the light-transmissive resin material, a silicone resin is used, for example, but an epoxy resin, a urea resin, or the like may be used. As the yellow phosphor particles, an yttrium aluminum garnet (YAG)-based phosphor particles are used, for example.

In this configuration, the wavelength of a portion of the blue light emitted from LED chips 12 is converted by the yellow phosphor particles contained in sealing member 13, so that the portion is transformed into yellow light. Then, the blue light not absorbed by the yellow phosphor particles and the yellow light resulting from the wavelength conversion by the yellow phosphor particles are diffused and mixed within sealing member 13. Consequently, white light is emitted from sealing member 13. Note that sealing member 13 also has a function of protecting LED chips 12 and bonding wire 17 from dust, moisture, external force, or the like.

Buffer layer 14 is an undercoat layer for forming dam member 15 and is formed on substrate 11. In Embodiment 1, buffer layer 14 is a glass coat layer formed by coating substrate 11 with glass. This means that buffer layer 14 is made of a glass material.

In Embodiment 1, buffer layer 14 is formed so as to bridge the wiring region and a region other than the wiring region. Thus, on substrate 11, there are a part where buffer layer 14 is formed so as to cover the wiring region (wiring 16) (illustrated in FIG. 4) and a part where buffer layer 14 is formed directly on substrate 11 (region R surrounded by a dot-and-dash line in FIG. 3).

Buffer layer 14 is provided so as to cover the pattern of wiring 16 having a substantially circular annular shape provided around, two or more LED chips 12. In other words, buffer layer 14 is formed in a circular annular shape so as to surround two or more LED chips 12 in a plan view of substrate 11. The outer shape of buffer layer 14 may be a rectangular annular shape. The thickness of buffer layer 14 is in the range from about 5 μm to 50 μm. Note that the thickness of buffer layer 14 can be increased to reduce the amount of a material to be used for dam member 15.

Dam member 15 serves to block sealing member 13. For example, a thermosetting resin or a thermoplastic resin having an insulating property is used as dam member 15. More specifically, a silicone resin, a phenol resin, an epoxy resin, a BT (bismaleimideatriazine) resin, PPA (polyphthalamide), or the like is used as dam member 15.

It is desirable that dam member 15 have a light-reflecting property n order to increase the light extraction rate of light-emitting apparatus 10. Thus, a resin in a white color (what is called a white resin) is used as dam member 15 in Embodiment 1. Note that in order to increase the light-reflecting property of dam member 15, $TiO_2$, $Al_2O_3$, $ZrO_2$, MgO, and the like particles may be contained in dam member 15.

As illustrated in FIG. 2, in light-emitting apparatus 10, dam member 15 is formed in a circular annular shape so as to surround two or more LED chips 12 in a plan view of substrate 11. With this, it is possible to increase the light extraction rate of light-emitting apparatus 10. Note that the outer shape of dam member 15 may be a rectangular annular shape as with the case of buffer layer 14.

Figure 5:
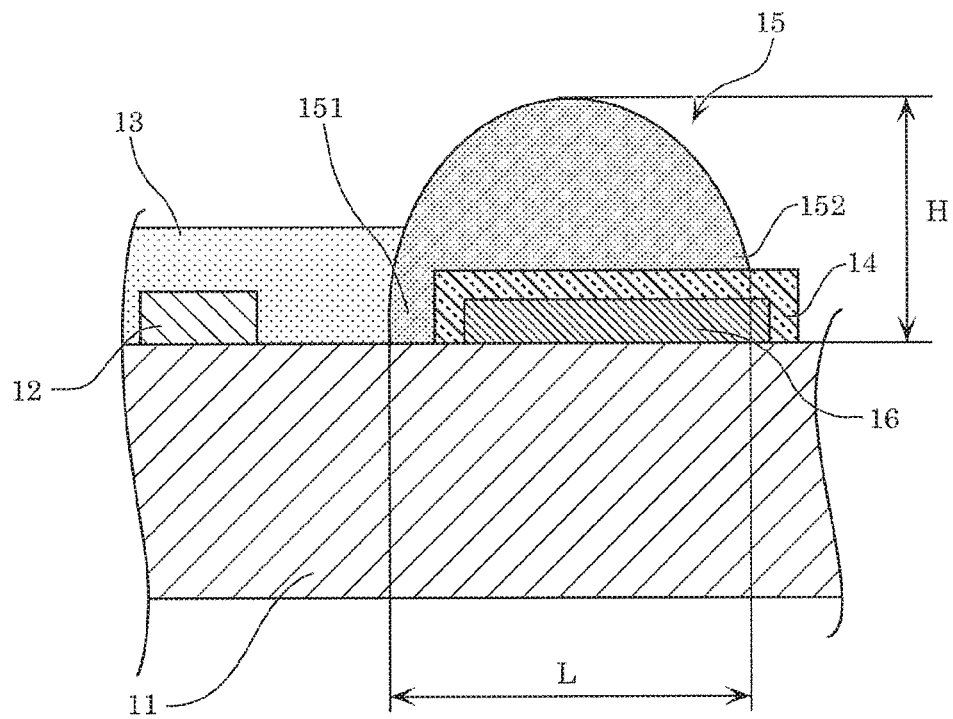
FIG. 5 is an enlarged cross-sectional view of a dam member according to Embodiment 1, schematically illustrating a configuration thereof.

FIG. 5 is an enlarged cross-sectional view of dam member 15 according to Embodiment 1, schematically illustrating a configuration thereof.

As illustrated in FIG. 5, the shape of a cross section of dam member 15 is a protruding shape with the tip pointing upward. At least a portion of dam member 15 is provided on a too surface of buffer layer 14. Specifically, dam member 15 is formed in such a way that one end portion 151 of dam member 15 which faces sealing, member 13 is in contact with substrate 11 and sealing member 13, and opposite end portion 152 of dam member 15 is out of contact with substrate 11. This means that one end portion 151 of annular dam member 15 is an end thereof which forms an inner rim of dam member 15 and is in contact with a top surface of substrate 11 over the entire circumference of dam member 15. On the other hand, opposite end portion 152 of dam member 15 is an end thereof which forms an outer rim of dam member 15 and is in contact with the top surface of buffer layer 14 without contacting substrate 11 over the entire circumference of dam member 15.

In this case, the relationship $1.2 \times H \leq L \leq 2.4 \times H$ may be satisfied where L is the length between one end and the opposite end of dam member 15 and H is the height between substrate 11 and the apex of dam member 15. The shape of dam member 15 can be stably maintained when this relationship is satisfied.

Method of Manufacturing Light-Emitting Apparatus

Figure 6:
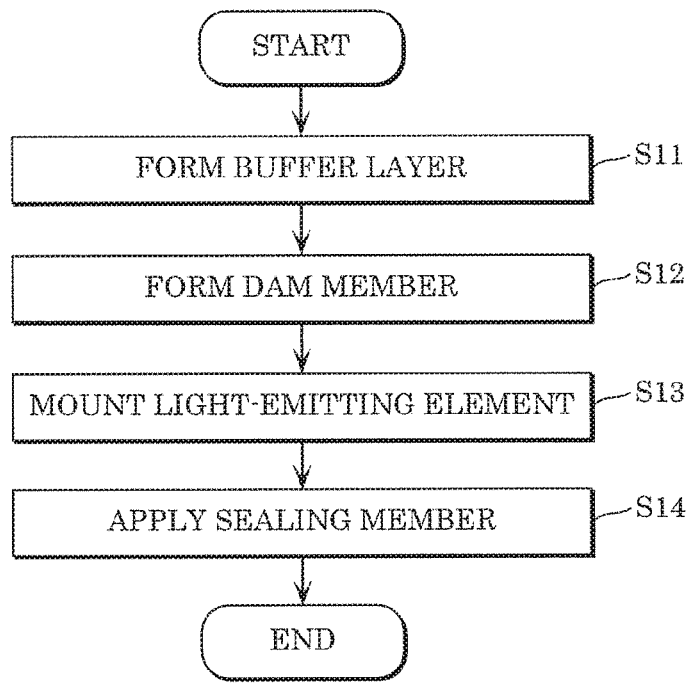
FIG. 6 is a flowchart of a method of manufacturing a light-emitting apparatus according to Embodiment 1.

Next, a method of manufacturing light-emitting apparatus 10 is described. FIG. 6 is a flowchart of a method of manufacturing light-emitting apparatus 10. FIG. 7A to FIG. 7D are cross-sectional views each illustrating one step in a method of manufacturing light-emitting apparatus 10. Note that FIG. 7A to FIG. 7D are views corresponding to FIG. 4.

Figure 7A:
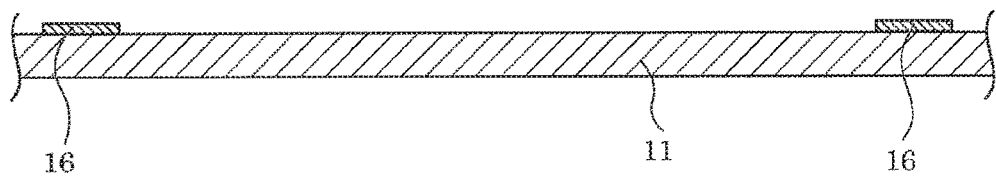
FIG. 7A is a cross-sectional view illustrating one step in a method of manufacturing a light-emitting apparatus according to Embodiment 1.

First, as illustrated in FIG. 7A, buffer layer 14 is formed on substrate 11 on which wiring 16 has been formed in advance (S11). Specifically, buffer layer 14 is formed as follows.

First, a solvent is added to fritted glass in powder form (powdery glass), and the resultant is kneaded to prepare paste for forming buffer layer 14.

Next, the paste for forming buffer layer 14 is printed in a predetermined shape at a predetermined position on substrate 11. In Embodiment 1, the paste is printed in a circular annular shape so as to surround two or more LED chips 12.

Note that the paste for forming buffer layer 14 may be applied instead of being printed.

Figure 7B:
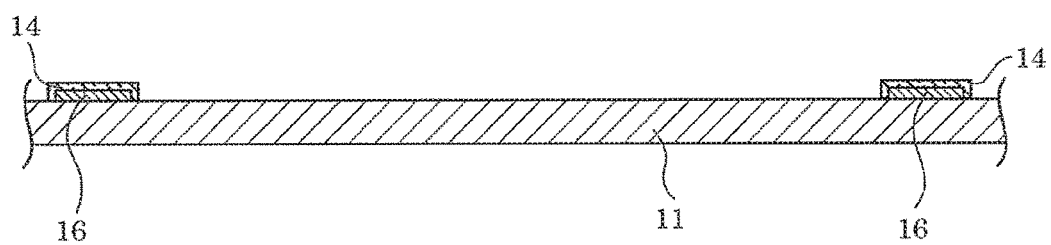
FIG. 7B is a cross-sectional view illustrating one step in a method of manufacturing a light-emitting apparatus according to Embodiment 1.

Next, substrate 11 on which the paste for forming buffer layer 14 has been printed is sintered. As a result of substrate 11 being sintered, a glass frit in the paste for forming buffer layer 14 is softened, forming a glass-sintered film as buffer layer 14 on substrate 11 or wiring 16 as illustrated in FIG. 7B.

Figure 7C:
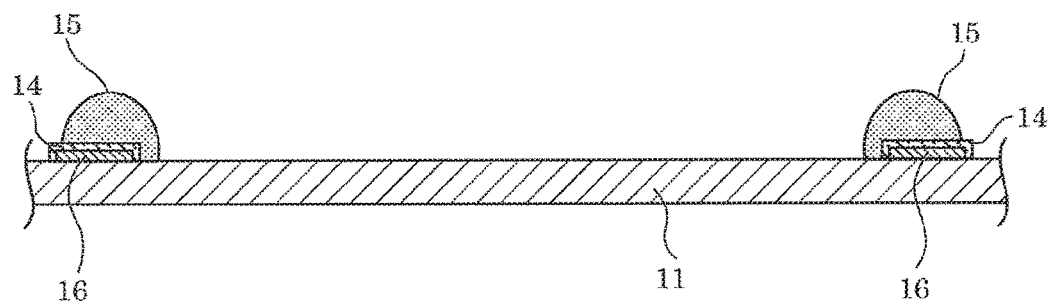
FIG. 7C is a cross-sectional view illustrating one step in a method of manufacturing a light-emitting apparatus according to Embodiment 1.

After buffer layer 14 is formed, dam member 15 is formed on the top surface of buffer layer 14 as illustrated in FIG. 7C (S12). Dam member 15 is formed so as to have one end 151 in contact with substrate 11 and opposite end 152 out of contact with substrate 11, and is formed in a circular annular shape as is buffer layer 14. A dispenser that releases a white resin is used to form dam member 15.

Figure 7D:
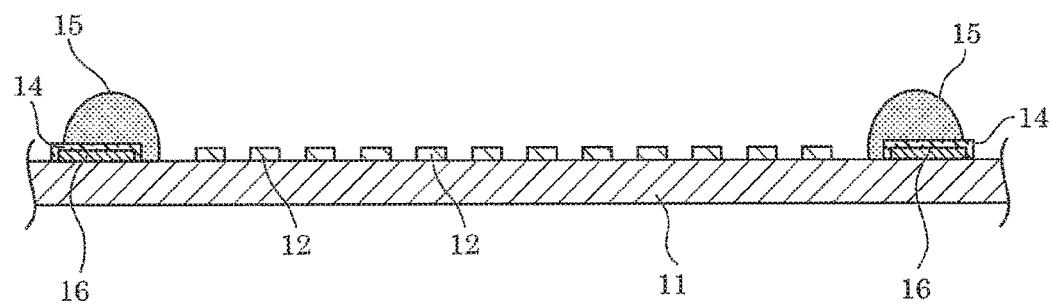
FIG. 7D is a cross-sectional view illustrating one step in a method of manufacturing a light-emitting apparatus according to Embodiment 1.

Next, two or more LED chips 12 are mounted on substrate 11 as illustrated in FIG. 7D (S13). A die-attach material or the like is used to mount LED chips 12 by die bonding. At this time, two or more LED chips 12 are electrically connected to each other by bonding wire 17 and wiring 16.

Sealing member 13 fills (is applied to) the inside as illustrated in FIG. 4 (S14). Specifically, a light-transmissive resin material containing yellow phosphor particles is injected into the region surrounded by dam member 15 and then is cured by heating, light irradiation, or the like.

Advantageous Effects, Etc.

In order to make a comparison with light-emitting apparatus 10 according to the present embodiment, the following describes Comparative Examples 1 and 2. Note that light-emitting apparatus 10 according to the present embodiment and light-emitting apparatuses according to Comparative Examples 1 and 2 are the same except where the dam member is provided. Therefore, in the descriptions of Comparative Examples 1 and 2 below, portions equivalent to those in light-emitting apparatus 10 according to the present embodiment are assigned the same reference signs, and descriptions thereof are omitted.

First, Comparative Example 1 is described.

Figure 8:
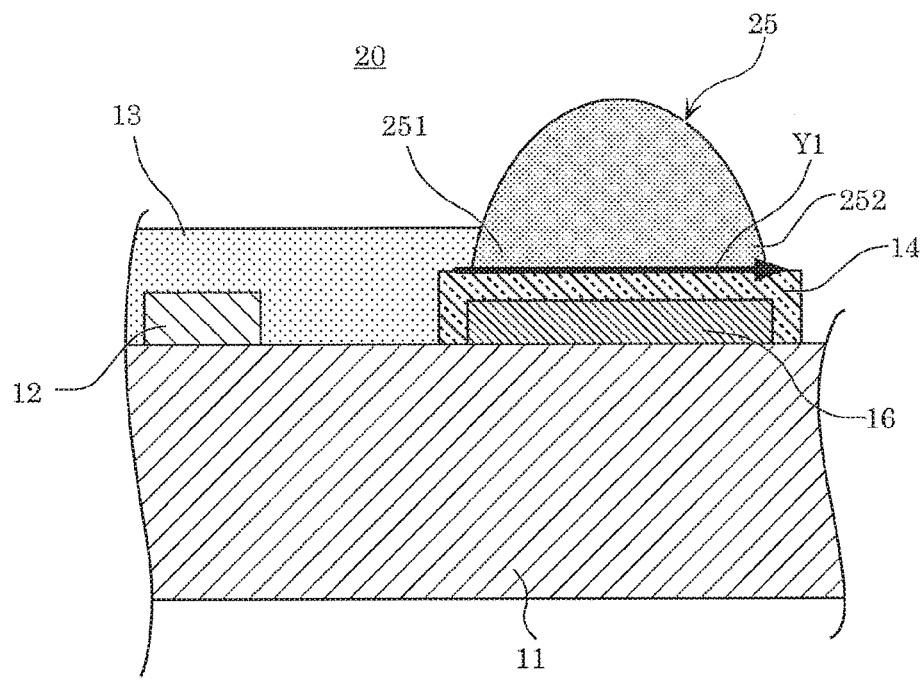
FIG. 8 is a cross-sectional view illustrating relevant components in a light-emitting apparatus according to Comparative Example 1.

FIG. 8 is a cross-sectional view illustrating relevant components in light-emitting apparatus 20 according to Comparative Example 1. Specifically, FIG. 8 corresponds to FIG. 5.

As illustrated in FIG. 8, an area where dam member 25 of light-emitting apparatus 20 is provided is on and within the top surface of buffer layer 14. This means that dam member 25 between one end 251 and opposite end 252 thereof is out of contact with substrate 11. In this case, the interface between dam member 25 and buffer layer 14 is flat, and one end of this interface (the end thereof facing sealing member 13) is exposed to sealing member 13. Thus, there are cases where sealing member 13 before cured seeps out of dam member 25 through the interface between dam member 25 and buffer layer 14 (see arrow Y1 in FIG. 8).

Next, Comparative Example 2 is described.

Figure 9:
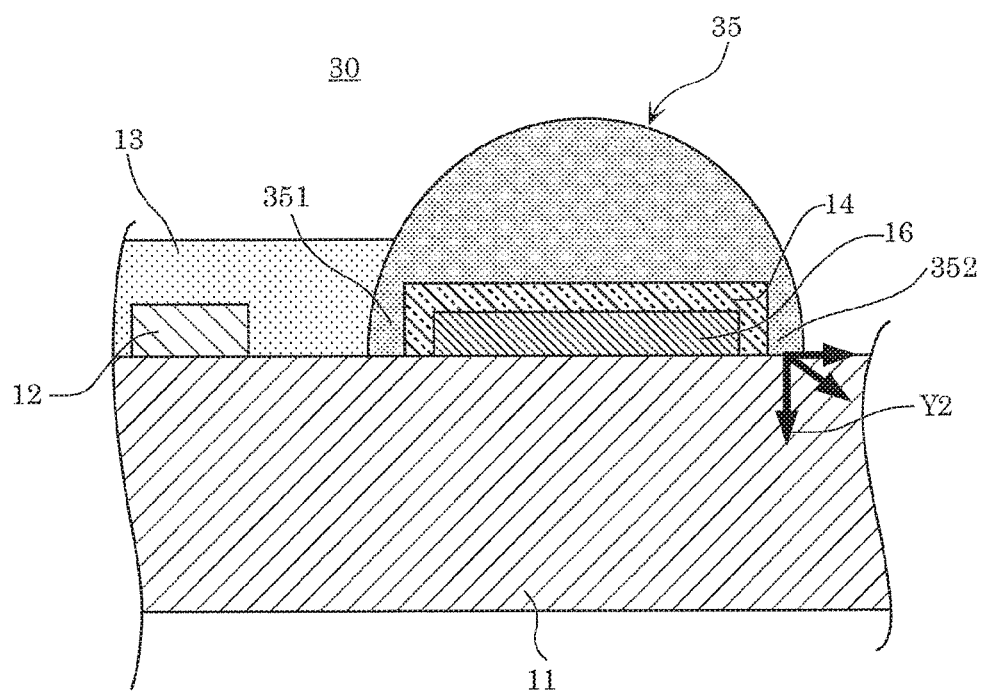
FIG. 9 is a cross-sectional view illustrating relevant, components in a light-emitting apparatus according to Comparative Example 2.

FIG. 9 is a cross-sectional view illustrating relevant components in light-emitting apparatus 30 according to Comparative Example 2. Specifically FIG. 9 corresponds to FIG. 5.

As illustrated in FIG. 9, an area where dam member 35 of light-emitting apparatus 30 is provided is larger than buffer layer 14 inward and outward from buffer layer 14. This means that dam member 35 covers entire buffer layer 14 and thus has one end 351 and opposite end 352 in contact with substrate 11. In this case, the interface between dam member 35 and buffer layer 14 is covered at one end 351 of dam member 35, and thus the one end of this interface (the end thereof facing sealing member 13) is not exposed to sealing member 13. With this, sealing member 13 is prevented from flowing through the interface between dam member 35 and buffer layer 14, so that the occurrence of sealing member 13 seeping out can be reduced. However, opposite end 352 of dam member 35 is in contact with substrate 11 outside of buffer layer 14 (an external region). There are cases where a low-molecular component of dam member 35 in contact with substrate 11 seeps into substrate 11 (see arrow Y2 in FIG. 9). A cause of this phenomenon has not yet been identified, but it is speculated that a low-molecular component of dam member 35 seeps into substrate 11 by capillary action, on the grounds that substrate 11 is a porous substrate. There is a risk that a low-molecular component of dam member 35 seeped into the external region of substrate 11 erodes an electrode in the external region, which may cause an electrode contact failure. Furthermore, the seeping may damage the appearance of substrate 11, causing appearance degradation.

In contrast, in light-emitting apparatus 10 according to the present embodiment, dam member 15 has one end 151 in contact with substrate 11 and opposite end 152 in contact with buffer layer 14 without being in contact with substrate 11. Thus, one end 151 of dam member 15 is in contact with substrate 11 in an area internal to buffer layer 14 so that sealing member 13 is prevented from seeping. On the other hand, dam member 15 is out of contact with substrate 11 in an area external to buffer layer 14 so that a component of dam member 15 is prevented from seeping into substrate 11. Thus, it is possible to reduce the occurrence of sealing member 13 or a component of the resin material constituting dam member 15 seeping into the external region so as to reduce the occurrence of contact failure of an electrode in the external region as well as degradation in the appearance of substrate 11.

As mentioned above, since one end 151 of dam member 151 is in contact with substrate 11 in the area internal to buffer layer 14, a low-molecular component of dam member 15 may seep in such an area. However, since the region surrounded by dam member 15 is covered by sealing member 13, degradation in the appearance of substrate 11 would not stand out. Furthermore, since LED chips 12 are connected to each other in a chip-to-chip configuration by bonding wire 17, an electrode contact failure due to the seeping is less likely.

Furthermore, since buffer layer 14 and dam member 15 are each formed in an annular shape so as to surround LED chip 12 in a plan view of substrate 11, sealing member 13 or a component of the resin material constituting dam member 15 can be prevented from seeping into the external region, over the entire circumference.

Furthermore, since the relationship $1.2 \times H \leq L \leq 2.4 \times H$ is satisfied where L is the length between one end and the opposite end of dam member 15 and H is the height between substrate 11 and the apex of dam member 15, the shape of dam member 15 can be stably maintained, allowing a reduction in the occurrence of opposite end 152 of dam member 15 falling off buffer layer 14 and contacting substrate 11.

Note that $L=1.5 \times H$ is more preferred.

Furthermore, since buffer layer 14 is formed using a glass material, adhesive strength between buffer layer 14 and dam member 15 can be increased. With this, it is possible to reduce the occurrence of sealing member 13 flowing through the interface between buffer layer 14 and dam member 15.

Note that when buffer layer 14 is formed using a glass material, there is a possibility that due to buffer layer 14 being transparent, light leaking from buffer layer 14 becomes a problem.

Therefore, buffer layer 14 may include a light-reflecting member. Specifically; the light-reflecting member is, for example, $TiO_9$, $Al_2O_3$, $ZrO_2$, MgO, and the like particles, but may be other members so long as such members have a light-reflecting property.

Thus, light leakage from buffer layer 14 can be reduced by buffer layer 14 including the light-reflecting member.

Embodiment 2

Figure 10:
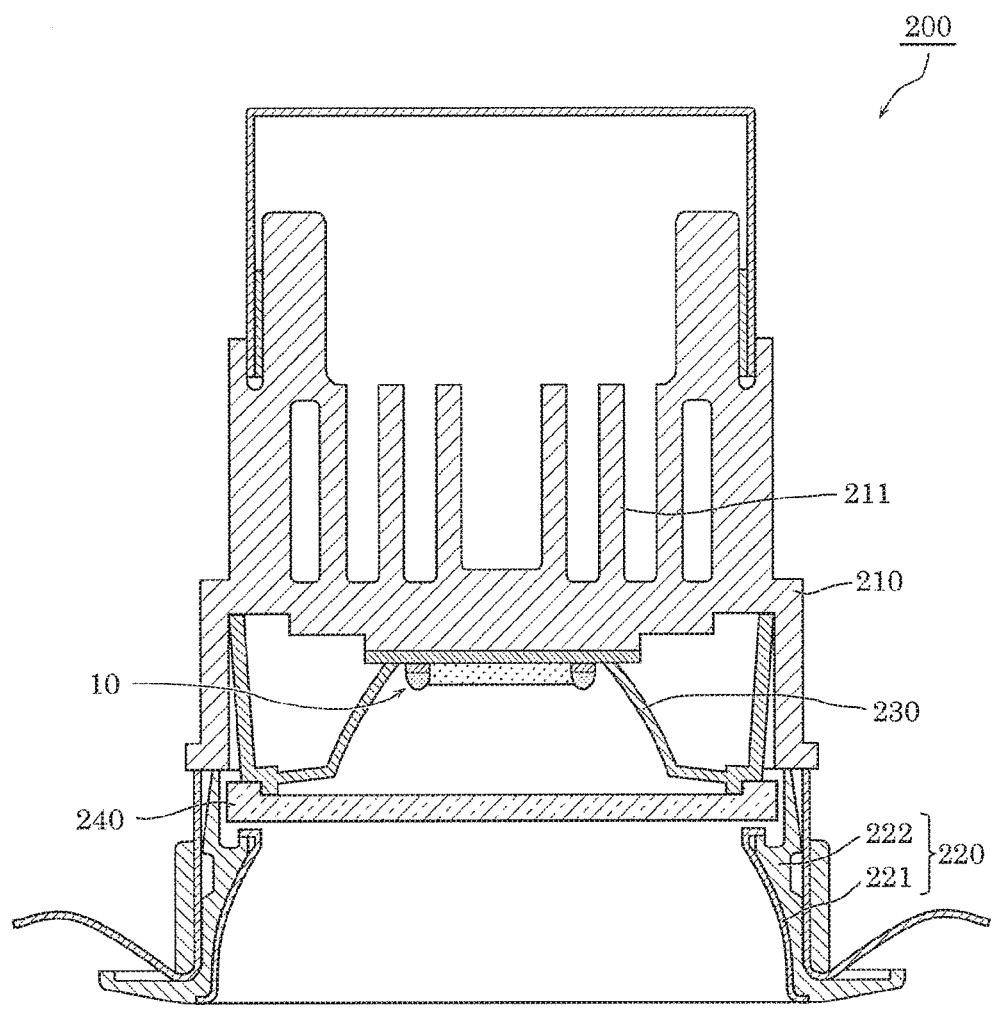
FIG. 10 is a cross-sectional view of an illumination apparatus according to Embodiment 2.
Figure 11:
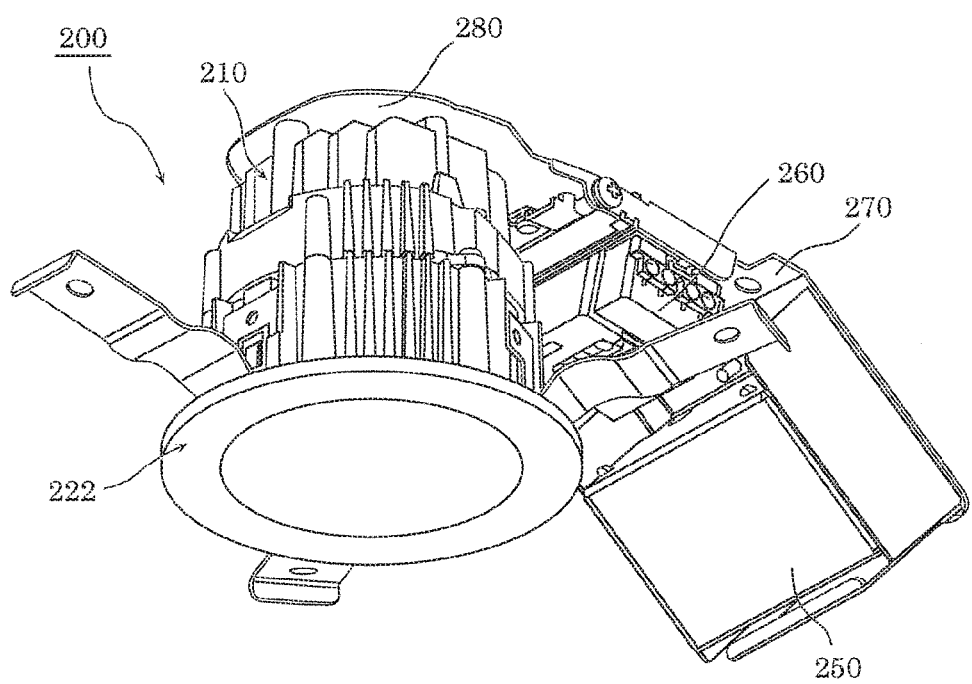
FIG. 11 is a perspective view of external appearances of an illumination apparatus and peripheral members thereof according to Embodiment 2.

Next, illumination apparatus 200 according to Embodiment 2 is described with reference to FIG. 10 and FIG. 11. FIG. 10 is a cross-sectional view of illumination apparatus 200 according to Embodiment 2. FIG. 11 is a perspective view of external appearances of illumination apparatus 2 and peripheral members thereof according to Embodiment 2.

As illustrated in FIG. 10 and FIG. 11, illumination apparatus 200 according to Embodiment 2 is a sunken illumination apparatus, such as a recessed light, that emits light downward (toward the floor or a wall, for example) by being installed, for example, in the ceiling of a house.

Illumination apparatus 200 includes light-emitting apparatus 10. Illumination apparatus 200 further includes an apparatus body in the shape of a substantial bottomed tube formed by joining pedestal 210 and frame 220, and reflection plate 230 and light-transmissive panel 240 disposed on this apparatus body.

Pedestal 210 is an attachment base to which light-emitting apparatus 10 is attached, and also serves as a heat sink for dissipating heat generated by light-emitting apparatus 10. Pedestal 210 is formed into a substantially columnar shape using a metal material and is, in Embodiment 2, made of die-cast aluminum.

Two or more heat-dissipating fins 211 are provided at predetermined intervals along one direction on the top portion (ceiling-side portion) of pedestal 210 so as to protrude upward. With this, heat generated by light-emitting apparatus 10 can be efficiently dissipated.

Frame 220 includes: cone portion 221 including a reflective surface on an inner surface and having a substantially circular tube shape; and frame body 222 to which cone portion 221 is attached. Cone portion 221 is formed using a metal material and can, for example, be formed of an aluminum alloy or the like by metal spinning or pressing. Frame body 222 is formed of a hard resin material or a metal material. Frame 220 is fixed by frame body 222 being attached to pedestal 210.

Reflection plate 230 is a circular-annular-frame-shaped (funnel-shaped) reflection member having an inner surface reflection function. For example, reflection plate 230 can be formed using a metal material such as aluminum. Note that reflection plate 230 may be formed using a hard white resin material instead of a metal material.

Light-transmissive panel 240 is a light-transmissive member having light-diffusing properties and light-transmitting properties. Light-transmissive panel 240 is a flat plate disposed between reflection plate 230 and frame 220, and is attached to reflection plate 230. For example, light-transmissive panel 240 can be formed into a disc shape using a transparent resin material such as acrylic or polycarbonate.

Note that illumination apparatus 200 is not required to include light-transmissive panel 240. Without light-transmissive panel 240, illumination apparatus 200 allows an improvement in the luminous flux of light that is output therefrom.

Furthermore, as illustrated in FIG. 11, lighting apparatus 250 which supplies lighting power to light-emitting apparatus 10, and terminal base 260 which relays AC power from a commercial power supply to lighting apparatus 250 are connected to illumination apparatus 200.

Lighting apparatus 250 and terminal base 260 are fixed to attachment plate 270 provided separately from the apparatus body. Attachment plate 270 is formed by folding a rectangular plate member made of a metal material, and has one longitudinal end the bottom surface of which lighting apparatus 250 is fixed to and the other longitudinal end the bottom surface of which terminal base 260 is fixed to. Attachment plate 270 is connected together with top plate 280 which is fixed to a top portion of pedestal 210 of the apparatus body.

In illumination apparatus 200 as a result of including light-emitting apparatus 10, the occurrence of electrode contact failure, appearance degradation, or the like is reduced. Thus, it can be said that illumination apparatus 200 is highly reliable.

Although the illumination apparatus is exemplified as a recessed light in Embodiment 2, the illumination apparatus according to the present disclosure may be implemented as a spotlight or a different illumination apparatus.

Other Embodiments

Although light-emitting apparatus 10 and illumination apparatus 200 according to the embodiments have been described above, the present disclosure is not limited to the above-described embodiments.

Furthermore, although buffer layer 14 and dam member 15 are each formed in an annular shape so as to surround LED chip 12 in the above embodiments, the shape, etc., of buffer layer 14 and dam member 15 is not particularly limited.

Furthermore, in the above embodiments, light-emitting apparatus 10 outputs white light using a combination of LED chip 12 that emits blue light with the yellow phosphor particles, but the configuration for outputting white light is not limited to that described above.

For example, a phosphor-containing resin that contains red phosphor particles and green phosphor particles may In combined with LED chip 12. Alternatively, an ultraviolet LED chip that outputs ultraviolet light having a wavelength shorter than that of light output from LED chip 12 may be combined with blue phosphor particles, red phosphor particles, and green phosphor particles that output blue light, red light, and green light, respectively, as a result of being excited mainly by ultraviolet light.

Furthermore, in the above embodiments, LED chip 12 mounted on substrate 11 is connected to another LED chip 12 in a chip-to-chip configuration by bonding wire 17. However, LED chip 12 may be connected by bonding wire 17 to wiring 16 (a metal film) provided on substrate 11, and thus electrically connected to another LED chip 12 via wiring 16.

Furthermore, the light-emitting element to be used in light-emitting apparatus 10 is exemplified as LED chip 12 in the above embodiments. However, a semiconductor light-emitting element, such as a semiconductor laser, or another type of solid-state light-emitting element, such as an electroluminescent (EL) element including an organic or inorganic EL material, may be used as the light-emitting element.

Furthermore, light-emitting elements of two or more types different in light-emission color may be used in light-emitting apparatus 10. For example, light-emitting apparatus 10 may include an LED chip that emits red light in addition to LED chip 12 for the purpose of increasing color rendering properties.

Furthermore, in the above embodiments, the seeping of dam member 1, into substrate 11 has been described as being caused by the capillary action of substrate 11. This is no more than speculation by the inventor of the present invention; it can be assumed that the aforementioned seeping may occur due to other causes. Therefore, the above-described configuration may be applied to a substrate different from the substrate in which capillary action can be observed if said substrate is subject to the aforementioned seeping.

While the foregoing has described one or more embodiments arid/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting apparatus comprising:
a ceramic substrate;
a light-emitting element mounted on the ceramic substrate;
a sealing member sealing the light-emitting element;
a buffer layer formed on the ceramic substrate and surrounding the light-emitting element; and
a dam member which blocks the sealing member from flowing outside the dam member,
wherein at least a portion of the dam member is provided on a top surface of the buffer layer, and
the dam member has one end in contact with the ceramic substrate and the sealing member, and an opposite end out of contact with the ceramic substrate, the one end facing the sealing member and being closer to the light-emitting element than the opposite end.

2. The light-emitting apparatus according to claim 1, wherein the buffer layer and the dam member are each formed in an annular shape surrounding the light-emitting element in a plan view of the ceramic substrate.

3. The light-emitting apparatus according to claim 1, wherein the relationship $1.2 \times H \leq L \leq 2.4 \times H$ is satisfied, where L is a length between the one end and the opposite end of the dam member and H is a height between the ceramic substrate and an apex of the dam member.

4. The light-emitting apparatus according to claim 1, wherein the buffer layer is made of a glass material.

5. The light-emitting apparatus according to claim 4, wherein the sealing member is made of a resin material.

6. The light-emitting apparatus according to claim 1, wherein the buffer layer includes a light-reflecting member.

7. The light-emitting apparatus according to claim 1, wherein wiring that is covered by the buffer layer is formed on the substrate.

8. The light-emitting apparatus according to claim 1, wherein the sealing member includes phosphor particles.

9. An illumination apparatus comprising
the light-emitting apparatus according to claim 1.

10. A method of manufacturing a light-emitting apparatus including: a ceramic substrate; a light-emitting element mounted on the ceramic substrate; a sealing member sealing the light-emitting element; a buffer layer formed on the ceramic substrate and surrounding the light-emitting element; and a dam member which blocks the sealing member from flowing outside the dam member, at least a portion of the dam member being provided on a top surface of the buffer layer, the method comprising forming the dam member with one end in contact with the ceramic substrate and an opposite end out of contact with the ceramic substrate, the one end facing the sealing member and being closer to the light-emitting element than the opposite end.

\* \* \* \* \*